US 8,705,170 B2

(12) United States Patent
Williamson et al.

(10) Patent No.: US 8,705,170 B2
(45) Date of Patent: Apr. 22, 2014

(54) HIGH NA CATADIOPTRIC IMAGING OPTICS FOR IMAGING A RETICLE TO A PAIR OF IMAGING LOCATIONS

(75) Inventors: David M. Williamson, Tucson, AZ (US); Michael B. Binnard, Belmont, CA (US); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 898 days.

(21) Appl. No.: 12/547,086

(22) Filed: Aug. 25, 2009

(65) Prior Publication Data

US 2010/0053738 A1   Mar. 4, 2010

Related U.S. Application Data

(60) Provisional application No. 61/093,104, filed on Aug. 29, 2008.

(51) Int. Cl.
*G02B 17/08* (2006.01)

(52) U.S. Cl.
USPC .............................. 359/364; 355/66; 356/247

(58) Field of Classification Search
USPC .................... 359/364; 355/66, 77; 356/247
See application file for complete search history.

(56) References Cited

U.S. PATENT DOCUMENTS

| | | | |
|---|---|---|---|
| 5,329,335 A | 7/1994 | Wada et al. | |
| 5,369,464 A | 11/1994 | Kamon | |
| 5,863,677 A | 1/1999 | Nakao | |
| 6,611,316 B2 | 8/2003 | Sewell | |
| 6,778,257 B2 | 8/2004 | Bleeker et al. | |
| 7,023,525 B2 | 4/2006 | Bleeker et al. | |
| 8,107,162 B2 * | 1/2012 | Dodoc et al. | 359/364 |
| 8,446,665 B2 * | 5/2013 | Epple et al. | 359/351 |
| 2006/0158615 A1 * | 7/2006 | Williamson | 353/37 |
| 2007/0013885 A1 | 1/2007 | Loopstra et al. | |
| 2007/0013890 A1 | 1/2007 | Loopstra et al. | |
| 2007/0013893 A1 | 1/2007 | Loopstra | |
| 2007/0013894 A1 | 1/2007 | Loopstra | |
| 2007/0153247 A1 | 7/2007 | Nagasaka | |
| 2007/0216884 A1 | 9/2007 | Nagasaka | |
| 2007/0242244 A1 | 10/2007 | Nagasaka | |
| 2007/0242254 A1 | 10/2007 | Nagasaka | |
| 2007/0242255 A1 | 10/2007 | Nagasaka | |
| 2007/0258077 A1 | 11/2007 | Tanaka et al. | |
| 2007/0273854 A1 | 11/2007 | Nagasaka | |
| 2007/0273858 A1 | 11/2007 | Nagasaka | |
| 2007/0279606 A1 | 12/2007 | Nagasaka | |
| 2007/0285767 A1 * | 12/2007 | Dodoc | 359/365 |

(Continued)

FOREIGN PATENT DOCUMENTS

| WO | WO2005/040890 | 5/2005 |
|---|---|---|
| WO | WO2005/111689 | 11/2005 |

(Continued)

*Primary Examiner* — Frank Font
(74) *Attorney, Agent, or Firm* — Yakov Sidorin; Quarles & Brady LLP; Lawrence R. Oremland

(57) ABSTRACT

New and useful concepts for an imaging optical system configured to simultaneously image a reticle to a pair of imaging locations are provided, where the imaging optics comprise a pair of arms, each of which includes catadioptric imaging optics. In addition, the imaging optics are preferably designed to image a reticle simultaneously to the pair of imaging locations, at a numerical aperture of at least 1.3, and without obscuration of light by the imaging optics.

14 Claims, 20 Drawing Sheets

(56) References Cited

U.S. PATENT DOCUMENTS

| | | |
|---|---|---|
| 2008/0013062 A1 | 1/2008 | Nagasaka |
| 2008/0094696 A1* | 4/2008 | Omura et al. ............... 359/364 |
| 2008/0246932 A1 | 10/2008 | Shigematsu |
| 2008/0259440 A1 | 10/2008 | Omura |
| 2009/0040490 A1 | 2/2009 | Shigematsu et al. |
| 2009/0073407 A1 | 3/2009 | Okita |
| 2009/0086186 A1 | 4/2009 | Muramatsu et al. |
| 2009/0135396 A1 | 5/2009 | Mizuno et al. |
| 2009/0153819 A1 | 6/2009 | Okita |
| 2011/0002032 A1* | 1/2011 | Omura ........................ 359/364 |
| 2012/0162625 A1* | 6/2012 | Dodoc et al. ................. 355/67 |
| 2012/0188636 A1* | 7/2012 | Ulrich et al. ................ 359/365 |
| 2013/0120728 A1* | 5/2013 | Epple et al. ................... 355/67 |

FOREIGN PATENT DOCUMENTS

| | | |
|---|---|---|
| WO | WO2007138834 | 12/2007 |
| WO | WO2008004654 | 1/2008 |
| WO | WO2008007632 | 1/2008 |
| WO | WO2008007633 | 1/2008 |

* cited by examiner

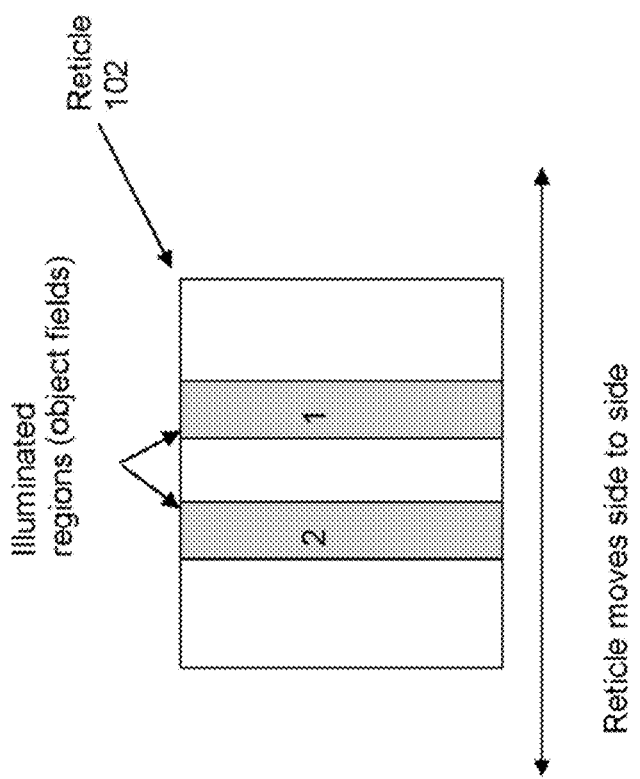

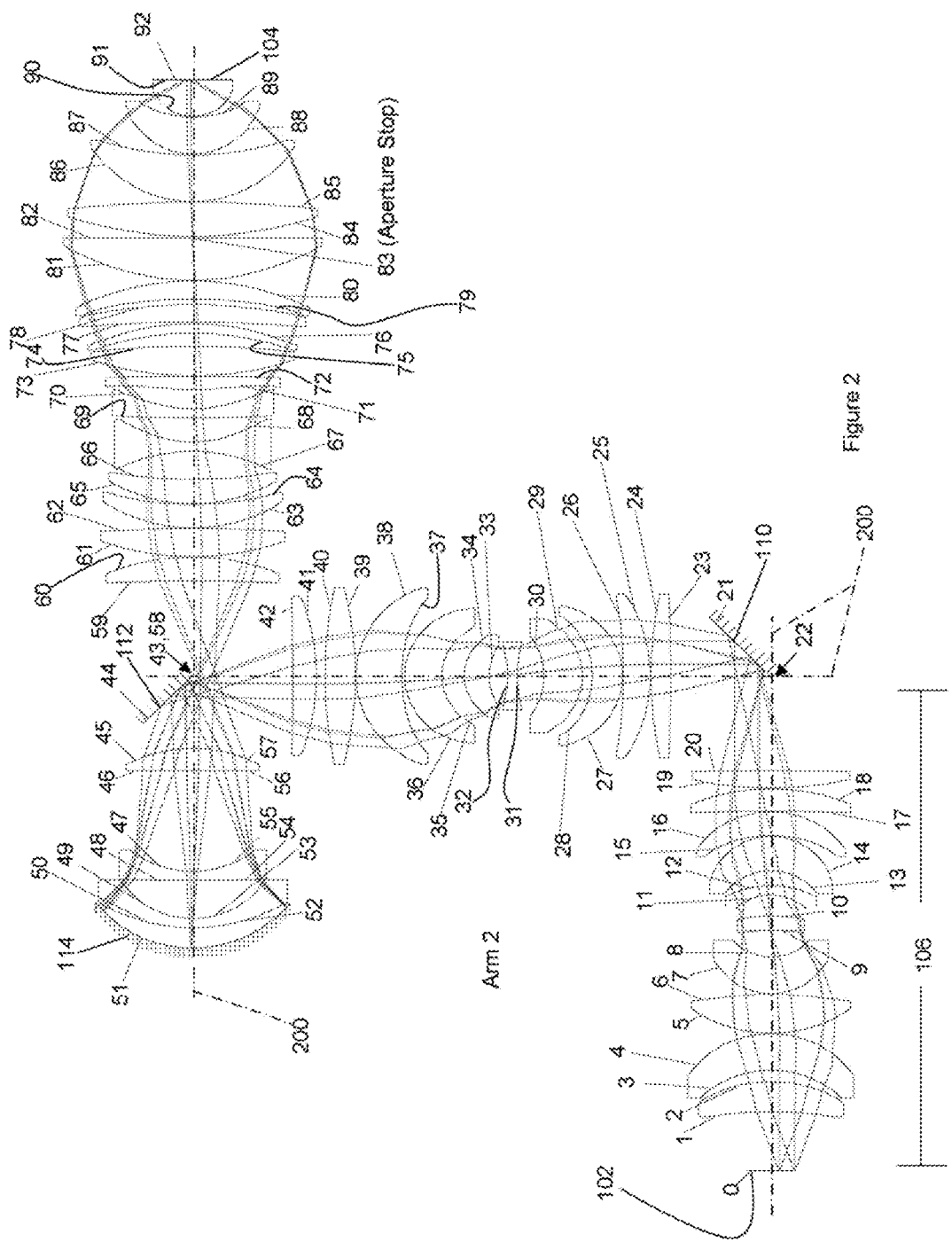

```
Sumo Lens - NA 1.35

APERTURE DIAMETER
ELEMENT    RADIUS OF CURVATURE
NUMBER     FRONT              BACK             THICKNESS     FRONT        BACK        GLASS

OBJECT     INF                                 81.9091
 1         -468.4961 CC       -170.4451 CX     40.7470       168.8699     181.3046    'SiO2'
                                               16.1560
 2         -127.0634 CC       -128.6398 CX     50.0000       182.0713     209.3685    'SiO2'
                                                1.0000
 3          177.0079 CX        A(1)            53.1176       200.9393     194.7512    'SiO2'
                                                1.0000
 4           81.5170 CX         63.5334 CC     50.0000       144.4827      97.0365    'SiO2'
                                               36.6926
 5         -323.5180 CC       -184.8810 CX     19.4749        81.6879      79.6276    'SiO2'
                                               29.1776
 6          -65.3865 CC       -126.1161 CX     12.5000        91.3636     112.5594    'SiO2'
                                               20.5213
 7          -72.1304 CC        -81.0113 CX     47.2351       117.3297     154.3688    'SiO2'
                                                1.0000
 8           A(2)             -114.4864 CX     33.2236       174.4434     187.3195    'SiO2'
                                                1.0000
 9        -2139.5674 CC       -267.7114 CX     29.9945       199.3838     201.8994    'SiO2'
                                                1.0000
10         451.5367 CX       -4571.3360 CX     24.3615       197.4640     194.3961    'SiO2'
                                              129.9998
           DECENTER( 1)
11         INF                                  0.0000                    C-1         REFL
                                                                          188.9784
                                             -130.0001
12        -3048.2678 CX        561.8059 CX    -25.4122       216.8605     218.7827    'SiO2'
                                               -1.0000
13         -210.4241 CX       -639.3427 CC    -34.9049       219.5255     214.1690    'SiO2'
                                               -1.0000
14          -98.1331 CX         A(3)          -39.2238       187.2298     165.7127    'SiO2'
                                              -13.1070
```

Figure 4a – Page 1

Sumo Lens – NA 1.35

| ELEMENT NUMBER | RADIUS OF CURVATURE FRONT | RADIUS OF CURVATURE BACK | THICKNESS | APERTURE DIAMETER FRONT | APERTURE DIAMETER BACK | GLASS |
|---|---|---|---|---|---|---|
| 15 | -87.6916 CX | -96.7674 CC | -50.0000 | 151.1750 | 110.5917 | 'SiO2' |
|  |  |  | -34.4286 |  |  |  |
| 16 | 178.4603 CC | -139.2510 CC | -12.5000 | 89.7100 | 75.9217 | 'SiO2' |
|  |  |  | -23.8155 |  |  |  |
| 17 | 76.1352 CC | 65.3546 CX | -32.1309 | 84.2904 | 110.7017 | 'SiO2' |
|  |  |  | -29.0337 |  |  |  |
| 18 | 74.1092 CC | 92.6226 CX | -48.5478 | 134.0287 | 179.2391 | 'SiO2' |
|  |  |  | -3.5554 |  |  |  |
| 19 | A(4) | 128.7943 CX | -59.5149 | 216.5873 | 235.7429 | 'SiO2' |
|  |  |  | -1.0000 |  |  |  |
| 20 | -506.6069 CX | 601.1672 CX | -39.3155 | 236.2163 | 233.9386 | 'SiO2' |
|  |  |  | -11.3142 |  |  |  |
| 21 | -313.6400 CX | A(5) | -30.2006 | 213.1557 | 205.5366 | 'SiO2' |
|  |  |  | -130.0001 |  |  |  |
|  | DECENTER( 2) |  | 0.0000 | 113.8903 |  |  |
| 22 |  | INF |  |  | C-2 |  |
| 23 | 182.9846 CX | INF | 100.0000 | 160.1694 | 159.2958 | 'SiO2' |
|  |  |  | 30.0000 |  |  |  |
|  |  |  | 138.6683 |  |  |  |
| 24 | A(6) | -2968.1313 CX | 12.5000 | 151.3436 | 179.3551 | 'SiO2' |
|  |  |  | 52.3310 |  |  |  |
| 25 | -108.0944 CC | -229.3434 CX | 12.5000 | 183.1889 | 238.5230 | 'SiO2' |
|  |  |  | 27.2708 |  |  |  |
| 26 |  | -160.0827 CC |  |  | 246.1628 | REFL |
| 27 | -229.3434 CX | -108.0944 CC | -12.5000 | 239.0219 | 185.5777 | 'SiO2' |
|  |  |  | -52.3310 |  |  |  |
| 28 | -2968.1313 CX | A(7) | -12.5000 | 184.5417 | 160.7970 | 'SiO2' |
|  |  |  | -138.6683 |  |  |  |
| 29 | INF | 182.9846 CX | -30.0000 | 166.2532 | 166.7148 | 'SiO2' |
|  |  |  | -100.0000 |  |  |  |
|  | DECENTER( 3) |  |  | 113.9038 |  |  |

Figure 4a – Page 2

Sumo Lens – NA 1.35

| ELEMENT NUMBER | RADIUS OF CURVATURE FRONT | | RADIUS OF CURVATURE BACK | | THICKNESS | APERTURE DIAMETER FRONT | APERTURE DIAMETER BACK | GLASS |
|---|---|---|---|---|---|---|---|---|
| 30 | 3037.9516 | CC | 286.5150 | CX | -32.9904<br>-1.0000 | 210.8445 | 217.7061 | 'SiO2' |
| 31 | -343.2530 | CX | 1731.5506 | CX | -37.9603<br>-1.0000 | 232.8497 | 232.2728 | 'SiO2' |
| 32 | -201.7254 | CX | -397.9364 | CC | -32.9299<br>-1.0000 | 226.7520 | 219.3523 | 'SiO2' |
| 33 | -209.2864 | CX | A(8) | | -32.4888<br>-39.0681 | 211.7014 | 201.6863 | 'SiO2' |
| 34 | 213.0645 | CC | A(9) | | -12.5000<br>-33.5182 | 196.4887 | 189.1591 | 'SiO2' |
| 35 | -1576.9542 | CX | A(10) | | -12.5000<br>-26.1950 | 191.7649 | 202.6903 | 'SiO2' |
| 36 | A(11) | | 4304.4935 | CX | -18.4485<br>-1.0000 | 208.3184 | 219.1717 | 'SiO2' |
| 37 | -412.4723 | CX | 1046.6625 | CX | -40.5184<br>-18.6228 | 251.3776 | 257.5725 | 'SiO2' |
| 38 | 355.7612 | CC | A(12) | | -12.5000<br>-2.6488 | 258.9147 | 264.4101 | 'SiO2' |
| 39 | 1522.9416 | CC | A(13) | | -23.6302<br>-7.3835 | 280.4981 | 286.4534 | 'SiO2' |
| 40 | A(14) | | 323.9249 | CX | -25.4440<br>-1.0000 | 287.0353 | 294.8767 | 'SiO2' |
| 41 | -317.7142 | CX | 109752.1722 | CX | -58.1716<br>-1.0000 | 327.3548 | 324.9209 | 'SiO2' |
| | | | | | -1.0000<br>APERTURE STOP | 324.5803<br>316.5827 | | |
| 42 | -507.6460 | CX | 1432.2646 | CX | -46.4238<br>-1.0000 | 316.5827 | 311.1737 | 'SiO2' |
| 43 | -152.5967 | CX | A(15) | | -64.2423<br>-1.7418 | 257.2883 | 240.6853 | 'SiO2' |
| 44 | -90.0336 | CX | A(16) | | -50.5203<br>-1.0000 | 168.6710 | 136.1175 | 'SiO2' |

Figure 4b – Page 1

```
Sumo Lens - NA 1.35

ELEMENT  RADIUS OF CURVATURE                APERTURE DIAMETER
NUMBER    FRONT        BACK     THICKNESS    FRONT    BACK      GLASS

45    -55.7052 CX    INF      -48.9551    99.7839  37.9906   'SiO2'
  46      INF          INF       -1.5000    37.9906  30.2186   'Water'
IMAGE     INF                                        30.2186
```

NOTES - Positive radius indicates the center of curvature is to the right
        Negative radius indicates the center of curvature is to the left
      - Dimensions are given in millimeters

- Thickness is axial distance to next surface

- Image diameter shown above is a paraxial value,
        it is not a ray traced value

```
APERTURE DATA

DIAMETER              DECENTER
APERTURE  SHAPE       X          Y          X         Y          ROTATION

C- 1    RECTANGLE   200.000    110.000    0.000    55.000         0.0

C- 2    RECTANGLE   300.000     90.000    0.000   -45.000         0.0
```

ASPHERIC CONSTANTS

2

Figure 4b – Page 2

$$Z = \frac{(CURV)Y^2}{1 + (1-(1+K)(CURV)^2 Y^2)^{1/2}} + (A)Y^4 + (B)Y^6 + (C)Y^8 + (D)Y^{10}$$
$$+ (E)Y^{12} + (F)Y^{14} + (G)Y^{16} + (H)Y^{18} + (J)Y^{20}$$

| ASPHERIC | CURV | K<br>E | A<br>F | B<br>G | C<br>H | D<br>J |
|---|---|---|---|---|---|---|
| A(1) | -0.00280187 | 0.000000<br>3.45350E-25 | 5.78190E-08<br>-1.02711E-29 | -1.23054E-12<br>0.00000E+00 | 6.47129E-17<br>0.00000E+00 | -3.44453E-21<br>0.00000E+00 |
| A(2) | -0.00599993 | 0.000000<br>7.31214E-25 | -4.38447E-08<br>-6.41434E-29 | -1.53426E-12<br>0.00000E+00 | -5.41807E-17<br>0.00000E+00 | -1.03521E-20<br>0.00000E+00 |
| A(3) | -0.00908403 | 0.000000<br>-3.11514E-24 | -6.87094E-08<br>0.00000E+00 | -2.48574E-12<br>0.00000E+00 | -3.42707E-16<br>0.00000E+00 | -6.04985E-21<br>0.00000E+00 |
| A(4) | 0.00423432 | 0.000000<br>-7.85464E-26 | 5.94703E-08<br>6.00281E-30 | -1.06790E-12<br>0.00000E+00 | 4.14822E-17<br>0.00000E+00 | 8.50645E-22<br>0.00000E+00 |
| A(5) | -0.00029038 | 0.000000<br>-2.36763E-26 | 3.95855E-09<br>5.44292E-31 | -6.11076E-13<br>0.00000E+00 | 1.09917E-17<br>0.00000E+00 | 2.16408E-22<br>0.00000E+00 |
| A(6) | -0.00848981 | 0.000000<br>-3.54273E-25 | 6.75208E-08<br>2.78737E-29 | -1.71024E-12<br>0.00000E+00 | -2.52203E-16<br>0.00000E+00 | -7.67730E-21<br>0.00000E+00 |
| A(7) | -0.00848981 | 0.000000<br>-3.54273E-25 | 6.75208E-08<br>2.78737E-29 | -1.71024E-12<br>0.00000E+00 | -2.52203E-16<br>0.00000E+00 | -7.67730E-21<br>0.00000E+00 |
| A(8) | -0.00150495 | 0.000000<br>1.17859E-24 | -2.96300E-08<br>-4.23829E-29 | 7.08852E-13<br>0.00000E+00 | 1.29901E-16<br>0.00000E+00 | -1.66400E-20<br>0.00000E+00 |
| A(9) | -0.00751341 | 0.000000<br>-7.61157E-24 | 6.00766E-08<br>2.01773E-28 | 4.53445E-12<br>0.00000E+00 | -7.13603E-16<br>0.00000E+00 | 1.27350E-19<br>0.00000E+00 |

Figure 4c – Page 1

|        |              |            |              |              |              |
|--------|--------------|------------|--------------|--------------|--------------|
| A(10)  | -0.005911239 | 0.000000   | 6.17815E-08  | 1.31135E-12  | 7.86156E-17  | -2.30471E-20 |
|        |              | 1.88654E-24 | -6.31481E-29 | 0.00000E+00 | 0.00000E+00 | 0.00000E+00 |
| A(11)  | -0.00266712  | 0.000000   | 9.92266E-08  | -4.87585E-13 | -1.40757E-17 | -4.66500E-21 |
|        |              | 1.52868E-25 | 5.36504E-31  | 8.16481E-34  | 0.00000E+00 | 0.00000E+00 |
| A(12)  | 0.00278084   | 0.000000   | 2.34677E-08  | 1.06063E-12  | -1.52028E-16 | 2.54003E-21  |
|        |              | 1.44957E-25 | -9.38959E-30 | 1.49463E-34  | 0.00000E+00 | 0.00000E+00 |
| A(13)  | 0.00200506   | 0.000000   | -2.09126E-08 | -5.69913E-13 | 1.18007E-16  | -3.83233E-21 |
|        |              | -9.67928E-26 | 9.28252E-30  | -1.18119E-34 | 0.00000E+00 | 0.00000E+00 |
| A(14)  | 0.00169196   | 0.000000   | 1.77066E-09  | 1.32897E-13  | 1.39209E-17  | -1.61406E-21 |
|        |              | 1.39974E-25 | -5.70098E-30 | 1.55792E-34  | 0.00000E+00 | 0.00000E+00 |
| A(15)  | -0.00311338  | 0.000000   | 4.83718E-08  | -3.55541E-12 | 1.89840E-16  | -5.06607E-21 |
|        |              | -2.08787E-25 | 1.83724E-29  | -4.03223E-34 | 0.00000E+00 | 0.00000E+00 |
| A(16)  | -0.00695208  | 0.000000   | -9.86944E-08 | -5.57315E-12 | -2.59364E-15 | 3.65014E-19  |
|        |              | -9.15990E-23 | 1.18309E-26  | -1.09672E-30 | 0.00000E+00 | 0.00000E+00 |

DECENTERING CONSTANTS

| DECENTER | X | Y | Z | ALPHA | BETA | GAMMA |
|----------|---|---|---|-------|------|-------|

Figure 4c – Page 2

```
D( 1 )       0.0000        0.0000        0.0000        0.0000   (BEND)
D( 2 )       0.0000        0.0000      -45.0000        0.0000   (BEND)
D( 3 )       0.0000        0.0000      -45.0000        0.0000
                                          0.0000        0.0000
```

A decenter defines a new coordinate system (displaced and/or rotated)
in which subsequent surfaces are defined. Surfaces following a decenter
are aligned on the local mechanical axis (z-axis) of the new coordinate
system. The new mechanical axis remains in use until changed by another
decenter. The order in which displacements and tilts are applied on a
given surface is specified using different decenter types and these
generate different new coordinate systems; those used here are explained
below. Alpha, beta, and gamma are in degrees.

DECENTERING CONSTANT KEY:

| TYPE | TRAILING CODE | ORDER OF APPLICATION |
|---|---|---|
| DECENTER | | DISPLACE (X,Y,Z) |
| | | TILT (ALPHA,BETA,GAMMA) |
| | | REFRACT AT SURFACE |
| | | THICKNESS TO NEXT SURFACE |
| DECENTER & BEND | BEND | DECENTER (X,Y,Z,ALPHA,BETA,GAMMA) |
| | | REFLECT AT SURFACE |
| | | BEND (ALPHA,BETA,GAMMA) |
| | | THICKNESS TO NEXT SURFACE |

Figure 4d

Y-wing lens - NA 1.35

| ELEMENT NUMBER | RADIUS OF CURVATURE FRONT | RADIUS OF CURVATURE BACK | THICKNESS | APERTURE DIAMETER FRONT | APERTURE DIAMETER BACK | GLASS |
|---|---|---|---|---|---|---|
| OBJECT | | INF | 81.9091 | | | |
| 1 | -1025.1433 CC | -202.6677 CX | 50.0000 | 176.0208 | 191.2664 | 'SiO2' |
| | | | 28.0873 | | | |
| 2 | 477.8425 CX | -364.6200 CX | 39.5666 | 205.2044 | 204.9420 | 'SiO2' |
| | | | 1.0530 | | | |
| 3 | 98.5264 CX | A(1) | 56.7531 | 177.9901 | 164.8206 | 'SiO2' |
| | | | 1.0000 | | | |
| 4 | 84.2591 CX | 71.2055 CC | 28.8775 | 129.1000 | 96.1525 | 'SiO2' |
| | | | 38.6401 | | | |
| 5 | -348.0714 CC | -676.6131 CX | 12.5003 | 80.1990 | 90.0517 | 'SiO2' |
| | | | 33.1635 | | | |
| 6 | -51.5198 CC | -84.5305 CX | 12.5000 | 94.4212 | 124.9985 | 'SiO2' |
| | | | 28.4875 | | | |
| 7 | -69.9497 CC | -83.5300 CX | 29.2930 | 134.5606 | 164.6129 | 'SiO2' |
| | | | 1.6777 | | | |
| 8 | A(2) | -139.3177 CX | 47.4457 | 216.3046 | 241.1444 | 'SiO2' |
| | | | 52.7333 | | | |
| 9 | -252.9412 CC | -183.6198 CX | 54.2195 | 313.0564 | 325.3655 | 'SiO2' |
| | | | 17.1893 | | | |
| 10 | -2071.4163 CC | -352.2287 CX | 52.7504 | 361.1547 | 363.9073 | 'SiO2' |
| | | | 9.9758 | | | |
| | DECENTER( 1) | | | | | |
| 11 | | INF | 0.0000 | | 359.8476 C-1 | REFL |
| | | | -300.0000 | | | |
| | DECENTER( 2) | | | | | |
| 12 | | INF | 19.9280 | | 354.2355 C-2 | REFL |
| 13 | 672.7698 CX | -2980.1827 CX | 50.0000 | 355.3223 | | 'SiO2' |
| | | | 1.0000 | | | |
| 14 | 236.2591 CX | 474.7629 CC | 50.0000 | 342.5169 | 336.8732 | 'SiO2' |
| | | | 282.1634 | | | |

Figure 8a – Page 1

Y-wing lens - NA 1.35

| ELEMENT NUMBER | RADIUS OF CURVATURE FRONT | | RADIUS OF CURVATURE BACK | | THICKNESS | APERTURE DIAMETER FRONT | APERTURE DIAMETER BACK | GLASS |
|---|---|---|---|---|---|---|---|---|
| 15 | A(3) | | -575.4633 | CX | 12.5000 | 160.5344 | 159.4200 | 'SiO2' |
| | | | | | 28.0644 | | | |
| 16 | -134.0897 | CC | -2335.8601 | CX | 12.5000 | 157.6595 | 171.1549 | 'SiO2' |
| | | | | | 29.4388 | | | |
| 17 | | | -160.3308 | CC | -29.4388 | | 174.0547 | REFL |
| 18 | -2335.8600 | CX | -134.0897 | CC | -12.5000 | 161.5183 | 128.7806 | 'SiO2' |
| | | | | | -28.0644 | | | |
| 19 | -575.4633 | CX | A(4) | | -12.5000 | 111.7078 | 114.9237 | 'SiO2' |
| | | | | | -282.1634 | | | |
| 20 | 474.7629 | CC | 236.2591 | CX | -50.0000 | 299.9283 | 311.3032 | 'SiO2' |
| | | | | | -1.0000 | | | |
| 21 | -2980.1827 | CX | 672.7698 | CX | -50.0000 | 331.5581 | 337.8728 | 'SiO2' |
| | | | | | -19.9280 | | | |
| | DECENTER( 3) | | | | | 343.0758 | | |
| 22 | 3037.9516 | CC | 562.0997 | CX | -130.0135 | 358.7176 | 361.8367 | 'SiO2' |
| | | | | | -50.0000 | | | |
| | | | | | -6.5608 | | | |
| 23 | -258.3867 | CX | -650.2781 | CC | -52.8693 | 342.4201 | 335.3948 | 'SiO2' |
| | | | | | -75.8122 | | | |
| 24 | -303.3286 | CX | -587.1796 | CC | -26.6234 | 267.3839 | 258.7346 | 'SiO2' |
| | | | | | -52.7818 | | | |
| 25 | -477.8518 | CX | A(5) | | -14.4835 | 207.8667 | 193.4263 | 'SiO2' |
| | | | | | -133.0663 | | | |
| 26 | -212.3606 | CX | A(6) | | -12.5000 | 186.0684 | 177.1715 | 'SiO2' |
| | | | | | -40.6356 | | | |
| 27 | -472.1611 | CX | A(7) | | -12.5000 | 175.5361 | 167.6026 | 'SiO2' |
| | | | | | -34.0463 | | | |
| 28 | A(8) | | 863.0394 | CX | -25.0625 | 177.0760 | 182.1987 | 'SiO2' |
| | | | | | -6.6229 | | | |
| 29 | 1651.7572 | CC | -518.0563 | CC | -37.0955 | 188.2615 | 212.3219 | 'SiO2' |
| | | | | | -21.4480 | | | |
| 30 | -26595.1925 | CX | A(9) | | -40.6853 | 224.5290 | 232.9047 | 'SiO2' |

Figure 8a – Page 2

```
Y-wing lens - NA 1.35

ELEMENT    RADIUS OF CURVATURE                        APERTURE DIAMETER
NUMBER    FRONT           BACK         THICKNESS      FRONT        BACK       GLASS 31    2320.0259 CC    A(10)          -24.1649      254.7358    259.6662    'SiO2'
                                        -2.3532
  32    A(11)          576.1402 CX     -35.0746      266.4109    268.1989    'SiO2'
                                        -1.2945
  33    -282.4436 CX  12093.4740 CX    -44.6061      268.2646    264.6910    'SiO2'
                                        -1.0098
                                                     263.6765
                                        -1.0000
                                      APERTURE STOP  249.2071
  34    -338.9733 CX  -1745.6722 CC    -29.5118      249.2071    242.6323    'SiO2'
                                        -1.0000
  35    -172.7347 CX    A(12)          -35.3184      215.0191    204.8156    'SiO2'
                                        -1.0000
  36    -95.3655 CX     A(13)          -44.6412      159.6581    140.8885    'SiO2'
                                        -1.0000
  37    -47.2494 CX     INF            -38.1449       82.7920     34.8760    'SiO2'
  38    INF             INF             -0.8761       34.8760     13.9780    'Water'
IMAGE    INF                                          13.9780

NOTES - Positive radius indicates the center of curvature is to the right
        Negative radius indicates the center of curvature is to the left
      - Dimensions are given in millimeters

- Thickness is axial distance to next surface

- Image diameter shown above is a paraxial value,
        it is not a ray traced value
```

Figure 8b – Page 1

APERTURE DATA

| APERTURE | SHAPE | DIAMETER | | DECENTER | | ROTATION |
|---|---|---|---|---|---|---|
| | | X | Y | X | Y | |
| C-1 | RECTANGLE | 400.000 | 130.000 | 0.000 | 65.000 | 0.0 |
| C-2 | RECTANGLE | 400.000 | 170.000 | 0.000 | 75.000 | 0.0 |

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$
$$+ (E)Y^{12} + (F)Y^{14} + (G)Y^{16} + (H)Y^{18} + (J)Y^{20}$$

| ASPHERIC | CURV | K | A | B | C | D |
|---|---|---|---|---|---|---|
| | | E | F | G | H | J |
| A(1) | 0.00089733 | 0.000000 | 1.17245E-07 | 1.11128E-12 | 2.60663E-16 | 9.13474E-20 |
| | | -1.69815E-23 | 7.22010E-28 | 0.00000E+00 | 0.00000E+00 | 0.00000E+00 |
| A(2) | -0.00431870 | 0.000000 | -5.39475E-08 | -7.06114E-13 | -2.14483E-17 | -8.97819E-21 |
| | | 8.15340E-25 | -4.18445E-29 | 0.00000E+00 | 0.00000E+00 | 0.00000E+00 |

Figure 8b – Page 2

| | | | | | |
|---|---|---|---|---|---|
| A( 3) | -0.00760412 | 0.000000 | 1.29081E-07 | 3.34118E-12 | -3.18784E-16 | 3.64711E-21 |
| | | 6.99546E-24 | -1.39750E-27 | 0.00000E+00 | 0.00000E+00 | 0.00000E+00 |
| A( 4) | -0.00760412 | 0.000000 | 1.29081E-07 | 3.34118E-12 | -3.18784E-16 | 3.64711E-21 |
| | | 6.99546E-24 | -1.39750E-27 | 0.00000E+00 | 0.00000E+00 | 0.00000E+00 |
| A( 5) | -0.00421416 | 0.000000 | -3.84346E-08 | -9.45311E-13 | -2.67935E-17 | -8.54878E-21 |
| | | 6.52927E-25 | -3.85474E-29 | 0.00000E+00 | 0.00000E+00 | 0.00000E+00 |
| A( 6) | -0.00905212 | 0.000000 | 4.34919E-08 | 7.89531E-12 | 8.93614E-16 | 1.06857E-19 |
| | | -7.64529E-24 | 3.23439E-28 | 0.00000E+00 | 0.00000E+00 | 0.00000E+00 |
| A( 7) | -0.00936016 | 0.000000 | 6.02284E-08 | 9.12210E-13 | 4.94840E-16 | -2.30469E-20 |
| | | 2.48295E-23 | -2.34078E-27 | 0.00000E+00 | 0.00000E+00 | 0.00000E+00 |
| A( 8) | -0.00353920 | 0.000000 | 7.32986E-08 | -1.24575E-12 | 3.10458E-17 | -4.21681E-20 |
| | | 9.55049E-24 | -1.00994E-27 | 5.87250E-32 | 0.00000E+00 | 0.00000E+00 |
| A( 9) | 0.00396457 | 0.000000 | 8.47728E-09 | 1.41827E-12 | -1.55810E-16 | 8.00980E-22 |
| | | 7.67047E-26 | -7.55095E-30 | -5.66469E-34 | 0.00000E+00 | 0.00000E+00 |
| A(10) | 0.00236147 | 0.000000 | -2.93015E-08 | -5.53805E-13 | 1.24312E-16 | -3.21949E-21 |
| | | -4.11701E-26 | 1.09222E-29 | -1.70574E-34 | 0.00000E+00 | 0.00000E+00 |
| A(11) | -0.00127902 | 0.000000 | 6.59983E-09 | 7.24158E-14 | 8.43805E-18 | -1.75898E-21 |
| | | 1.51128E-25 | -4.36762E-30 | 7.68585E-35 | 0.00000E+00 | 0.00000E+00 |
| A(12) | -0.00275215 | 0.000000 | 4.66040E-08 | -3.50078E-12 | 1.86331E-16 | -6.56602E-21 |
| | | -2.59922E-25 | 3.57374E-29 | -1.01233E-33 | 0.00000E+00 | 0.00000E+00 |
| A(13) | -0.00210571 | 0.000000 | -1.73920E-07 | 1.56300E-11 | -3.12430E-15 | 5.25099E-19 |
| | | -5.18542E-23 | 2.23065E-27 | -6.55153E-33 | 0.00000E+00 | 0.00000E+00 |

Figure 8c – Page 1

```
DECENTERING CONSTANTS
DECENTER      X           Y           Z         ALPHA       BETA       GAMMA
-----------------------------------------------------------------------------
D( 1)      0.0000      0.0000      0.0000    -45.0000      0.0000     0.0000   (BEND)
D( 2)      0.0000      0.0000      0.0000    -45.0000      0.0000     0.0000   (BEND)
D( 3)      0.0000      0.0000      0.0000      0.0000      0.0000     0.0000
```

A decenter defines a new coordinate system (displaced and/or rotated)
in which subsequent surfaces are defined. Surfaces following a decenter
are aligned on the local mechanical axis (z-axis) of the new coordinate
system. The new mechanical axis remains in use until changed by another
decenter. The order in which displacements and tilts are applied on a
given surface is specified using different decenter types and these
generate different new coordinate systems; those used here are explained
below. Alpha, beta, and gamma are in degrees.

```
DECENTERING CONSTANT KEY:

TYPE           TRAILING CODE      ORDER OF APPLICATION
-----------------------------------------------------------------------------
DECENTER                             DISPLACE (X,Y,Z)
                                     TILT (ALPHA,BETA,GAMMA)
                                     REFRACT AT SURFACE
                                     THICKNESS TO NEXT SURFACE

DECENTER & BEND      BEND            DECENTER (X,Y,Z,ALPHA,BETA,GAMMA)
                                     REFLECT AT SURFACE
                                     BEND (ALPHA,BETA,GAMMA)
                                     THICKNESS TO NEXT SURFACE
-----------------------------------------------------------------------------
```

Figure 8c – Page 2

HIGH NA CATADIOPTRIC IMAGING OPTICS FOR IMAGING A RETICLE TO A PAIR OF IMAGING LOCATIONS

RELATED APPLICATION/CLAIM OF PRIORITY

This application is related to and claims priority from provisional application Ser. No. 61/093,104, filed Aug. 29, 2008, which provisional application is incorporated by reference herein.

BACKGROUND

The present invention relates to an imaging optical system that is designed to simultaneously image a single reticle to a pair of imaging locations.

In applicants' experience, in photolithographic systems and methods for imaging of substrates (e.g. in the creation of semiconductor wafers), there is a general need for high throughputs, while retaining high imaging resolution, particularly as wafer sizes get larger. As wafer sizes get larger (e.g. with wafer diameters on the order of 450 mm), the ability to improve throughput (e.g. via system architecture, scanning and/or imaging techniques) is an important objective. The present invention is specifically directed to imaging techniques designed to meet that objective.

SUMMARY OF THE PRESENT INVENTION

The present invention provides an optical imaging system that addresses the foregoing issues. The present invention provides an imaging optical system for imaging a reticle to a pair of imaging locations, with imaging optics configured to simultaneously image a reticle to the pair of imaging locations. The principles of the present invention are particularly useful in simultaneously imaging a pair of object fields of a single reticle to a pair of imaging locations.

In one of its basic aspects, an imaging optical system according to the principles of the present invention comprises imaging optics configured to simultaneously image a reticle to the pair of imaging locations, where the imaging optics comprise a pair of arms, each of which includes catadioptric imaging optics.

In a preferred configuration of the imaging optical system, the imaging optics comprises a V-fold mirror and an array of refractive optics located between a reticle and the V-fold mirror, and the catadioptric imaging optics of each of the pair of arms transmits light from the V-fold mirror to a respective imaging location. In addition, each of the pair of arms includes a respective plane mirror and a respective concave mirror, and the imaging optics of each of the pair of arms is configured to produce at least one intermediate image of a reticle that is being imaged to the imaging location associated with that arm. Still further, the optics of each of the pair of arms is configured to produce at least one intermediate image of a reticle that is being imaged to the imaging location associated with that arm, in proximity to the plane mirror of that arm, and in a manner that allows light to be incident on and reflected from the concave mirror without obscuration by the plane mirror.

There are currently two versions of an imaging optical system according to the present invention. In one version, the optics of each of the pair of arms includes an array of refractive optics between the V-fold mirror and the respective plane mirror of that arm. In another version, the imaging optics of each of the pair of arms includes direct transmission between the V-fold mirror and the respective plane mirror for that arm.

The latter version of the imaging optical system of the present invention is believed to provide a particularly compact configuration, which minimizes the number of optics that need to be aligned during set up of the system. That imaging optical system is characterized by imaging optics comprising a. a V-fold mirror, an array of refractive optics located between a reticle and the V-fold mirror, and
b. a pair of arms, each of which
   i. includes catadioptric imaging optics that transmits light from the V-fold mirror to a respective imaging location,
   ii. includes a plane mirror, and
   iii. includes direct transmission between the V-fold mirror and the plane mirror for that arm.

In addition, in preferred versions of an imaging optical system according to the principles of the present invention, a reticle is simultaneously imaged to the pair of imaging locations, at a numerical aperture of at least 1.3, and without obscuration of light by the imaging optics. Also, the imaging optical system is configured to transmit light from an ArF illumination source that illuminates the reticle. Thus, the principles of the present invention are particularly useful in an ArF Immersion photolithographic scanner.

An imaging optical system, according to the principles of the present invention, provides the ability to image, simultaneously, without moving optics, a single reticle to a pair of imaging locations (and thereby onto a pair of wafers). The advantage of using a single reticle is reduced cost of reticle ownership, compared with schemes that use two reticles.

These and other features of the present invention will be apparent from the following detailed description and the accompanying drawings.

BRIEF DESCRIPTION OF THE FIGURES

FIGS. 1, 1a, schematically illustrate one version of an optical imaging system designed to image a pair of wafers from a single reticle, according to the principles of the present invention;

FIG. 2 is a schematic illustration of a portion of the imaging optical system of FIG. 1, that is useful as a reference for the optics prescriptions of FIGS. 4a-4d (the portion of the imaging optical system is rotated 90 degrees counterclockwise from the orientation of FIG. 1);

FIGS. 4a-4d provide preferred prescriptions for the optics of the portion of the catadioptric imaging optical system of FIG. 2

FIGS. 8a-8c provide preferred prescriptions for the optics of the portion of the catadioptric imaging optical system of FIG. 5.

DETAILED DESCRIPTION

As described above, the present invention provides an optical imaging system configured to simultaneously image a single reticle to a pair of imaging locations. FIGS. 1-4 illustrate one version of an imaging optical system, according to the principles of the present invention, which applicants' sometimes refer to as the "Sumo" lens or system (that system is shown and described in provisional application Ser. No. 61/093,104 that has been incorporated by reference herein). FIGS. 5-8 illustrate another version of an imaging optical system, according to the principles of the present invention, that applicants' sometimes refer to as the "Y-Wing" lens or system.

In this application, reference to an "imaging location" means a location where an image of a reticle (the "object(s)" or "object field(s)") is produced at an image plane (the "image field(s)") on a substrate that is used in the creation of a semiconductor wafer. The wafer typically has a photoresist that is imaged and then the image is "developed" to produce the pattern(s) for the wafer. Thus, in this application, reference to an "imaging location" is intended to mean the type of imaging location where a substrate would be imaged in the formation of the patterns that are used to produce a semiconductor wafer. In addition, the concept of "imaging" a substrate may also be referred to in this art as "exposing" or "printing" the substrate with the image of the reticle. Still further, reference to "imaging a reticle" is intended to encompass transmitting an image of the entire reticle, or of portions of the reticle (e.g. the two different portions of the reticle of FIG. 1a). Moreover, reference to "simultaneously" imaging a reticle to the pair of imaging locations, is intended to allow for periods that one or a pair of wafers being imaged may be in undergoing a "wafer exchange" at the imaging location, as described further below. Still further, reference to "catadioptric imaging optics" means imaging optics that include at least one curved reflective surface (in the disclosed embodiments that curved reflective surface comprises a concave mirror).

It should also be noted that illumination ("exposure") of a reticle, and positioning of a reticle stage assembly during reticle exposure, can be provided, e.g. according to the principles of concurrently filed application Ser. No. 12/547,311, entitled "Exposure Apparatus With An Illumination System Generating Multiple Illumination Beams", which application is incorporated by reference herein.

Figure 1:
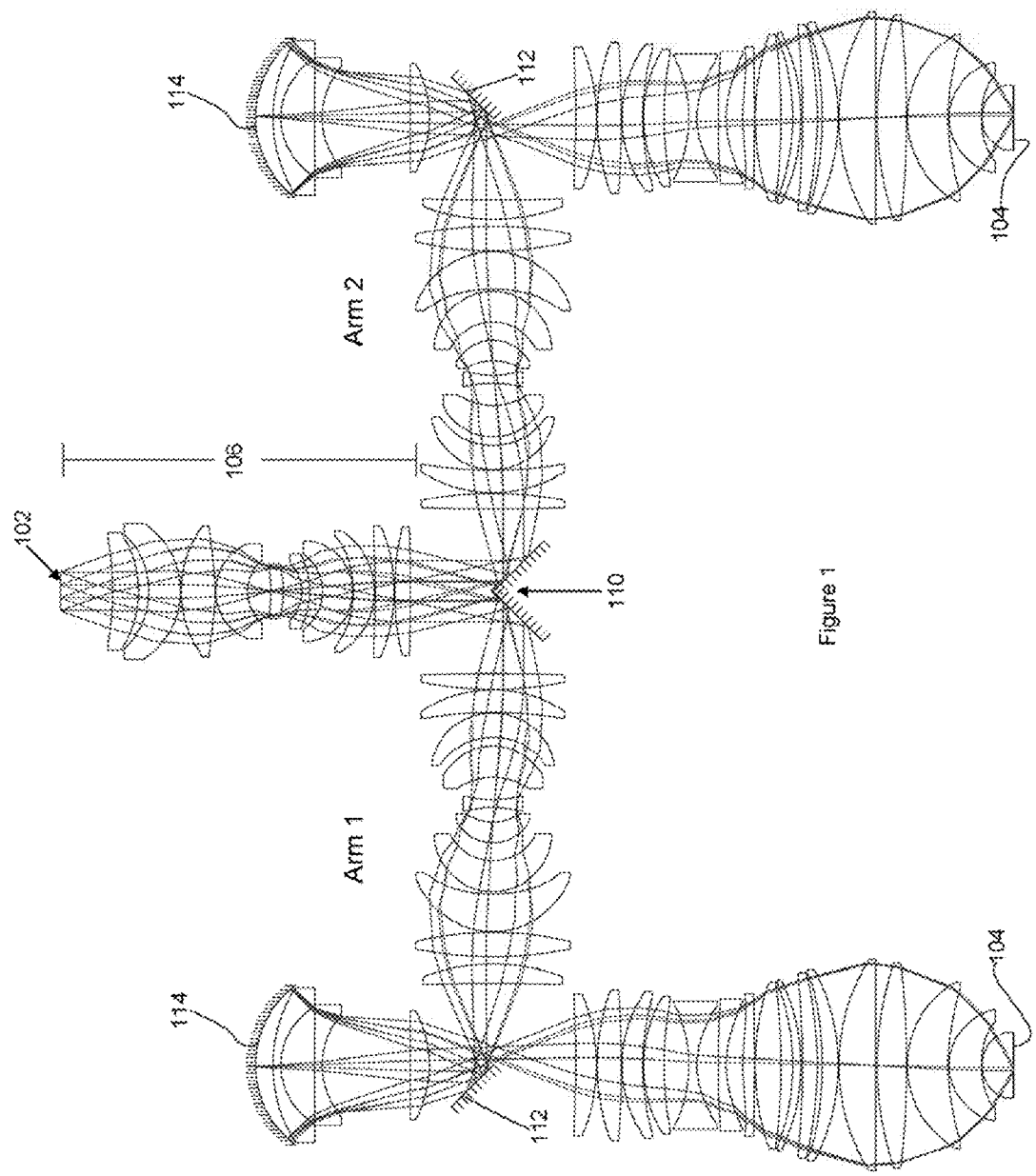

In the Sumo lens of FIGS. 1-4, as illustrated in FIGS. 1 and 1a, a single reticle 102 is simultaneously imaged to a pair of image planes 104 at imaging locations of the imaging optical system. The reticle 102 can move in the manner illustrated in FIG. 1a, and the reticle is illuminated by a pair of "slits" (narrow, rectangular illuminated regions) 1 and 2, which are imaged to respective image planes 104 (associated with slits 1 and 2, respectively) in the manner illustrated in FIG. 1. The slits 1 and 2 comprise different object fields of the reticle that are imaged to the pair of imaging locations by the imaging optical system. It is important to note that the position of the illumination slits is fixed relative to the imaging optics of the imaging optical system, while the reticle scans back and forth so that the entire reticle pattern passes through both of the slits.

The Sumo lens of FIGS. 1-4 basically comprises a central portion 106, with a series of refracting optics that transmit light from the reticle 102 to a V-fold mirror 110. The Sumo lens includes a pair of arms, labeled arm 1 and arm 2 in FIG. 1. Each arm comprises catadioptric optics, including (a) a plane mirror 112, a concave mirror 114, a series of refracting optics between the V-fold mirror 110 and the plane mirror 112, and a series of refracting optics between the concave mirror 114 and the imaging location 104 for that arm.

Figure 3:
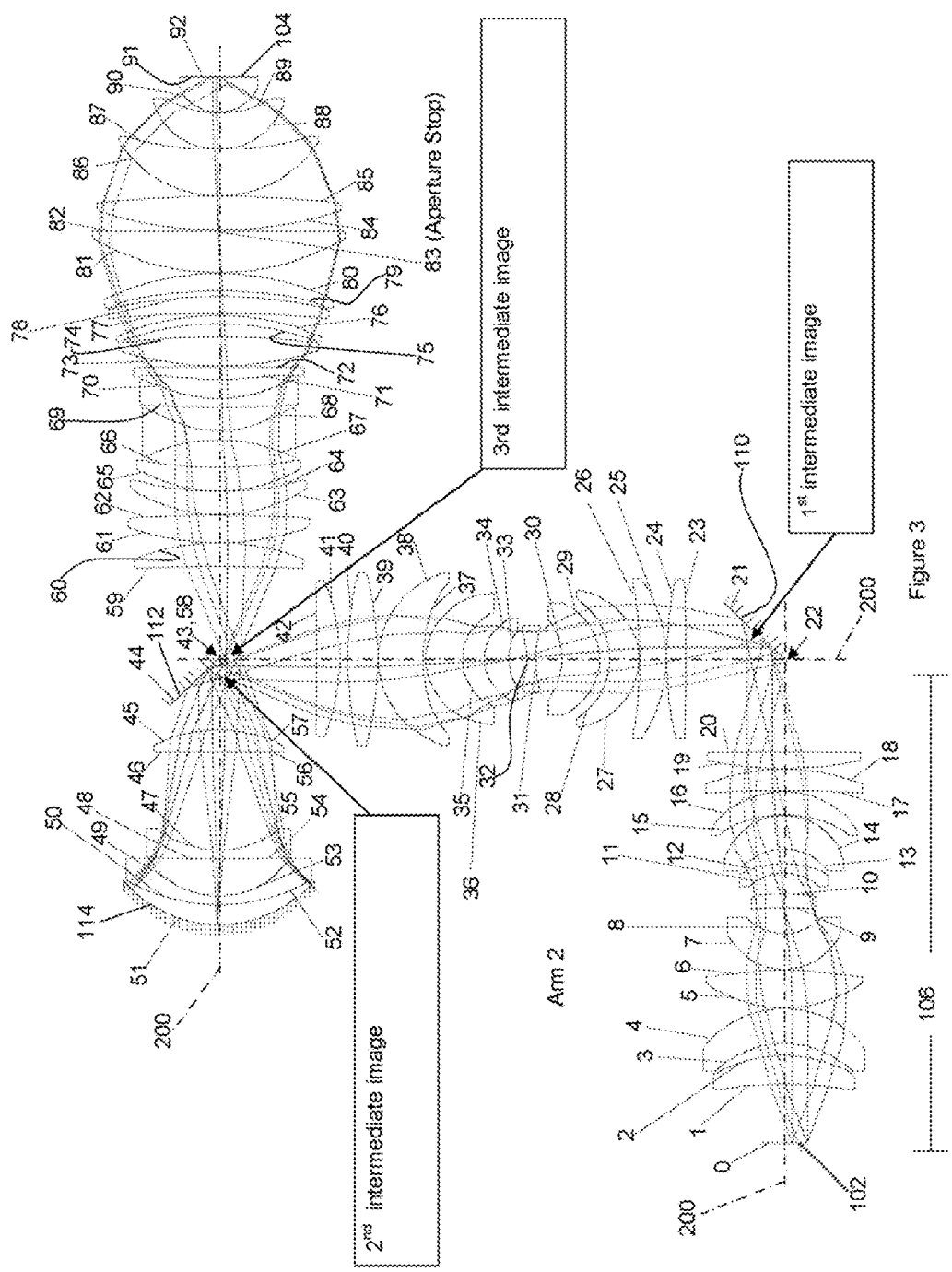
FIG. 3 is a schematic illustration of a portion of a catadioptric imaging optical system similar to FIG. 2, and showing the locations at which images of the reticle that are produced by the imaging optics, according to the principles of the present invention.
Figure 5:
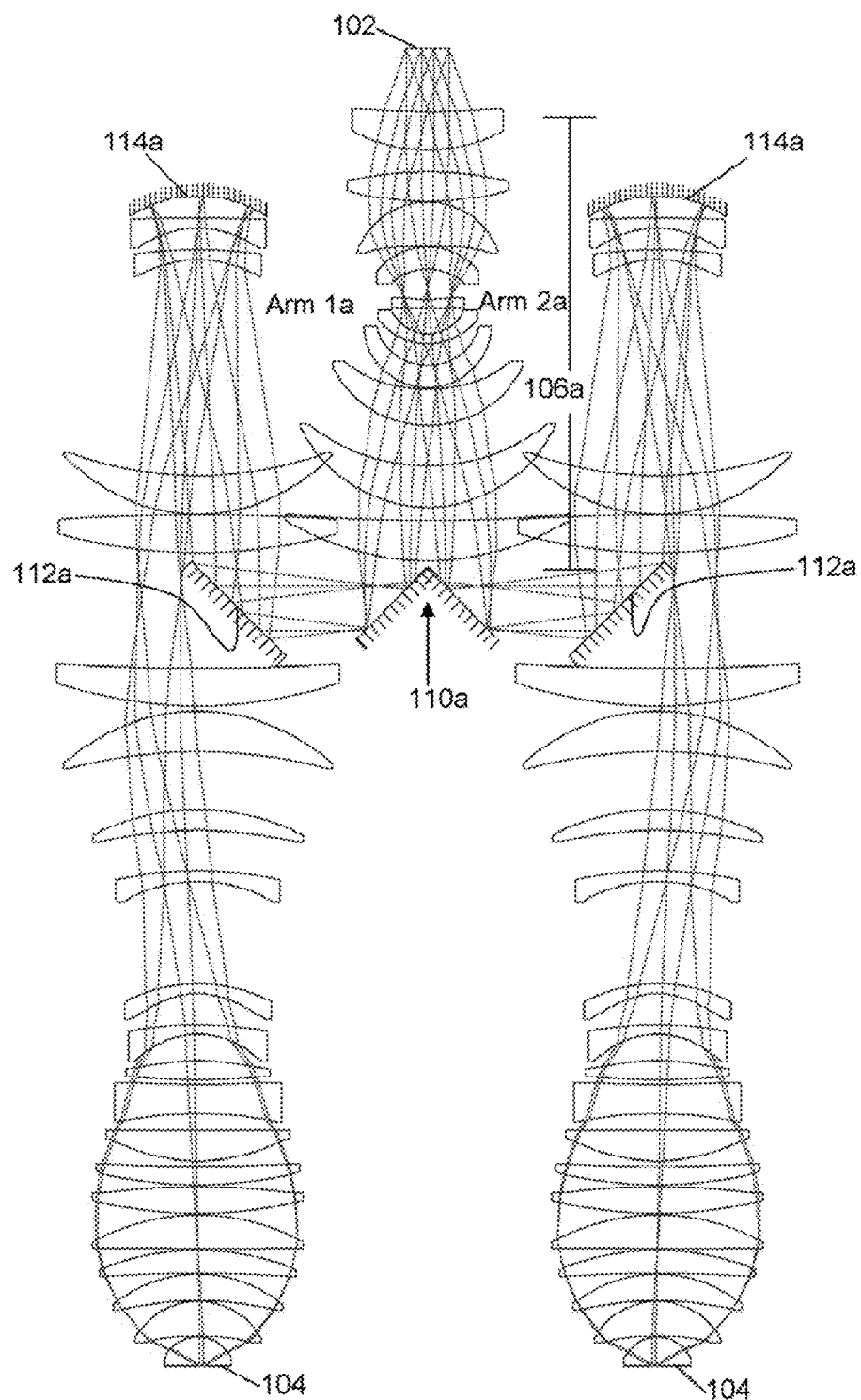
FIG. 5 schematically illustrates another version of an optical imaging system designed to image a pair of wafers from a single reticle, according to the principles of the present invention.

FIGS. 2 and 3 specifically illustrate the arm 2, and FIGS. 4a-4d provide the lens prescriptions for the optics of the central portion 106 and the arm 2. The optics of arm 1 are identical to the optics of arm 2, so that the lens prescriptions of FIGS. 4a-4d provide a complete description of the optics of the central portion and of both arms.

Moreover, in the Sumo lens of FIGS. 1-4, in the transmission of light from the reticle 102 to each imaging location 104, there are images of the reticle produced at three locations, and those locations are illustrated for the arm 2 in FIG. 3. It should be noted that one of those images is proximate the plane mirror 112 for that arm (where it is less likely to be affected by the transmitted light), and is located so that transmission of the image from the concave mirror 114 to the imaging location 104 is not obscured by the plane mirror 112.

Thus, as will be clear to those in the art, the Sumo lens of FIGS. 1-4 is configured to simultaneously image the reticle 102 to the pair of imaging locations 104. At each of the imaging locations, wafers are moved into position and are imaged, by movement of wafer stages to and from the imaging locations With both the Sumo lens of FIGS. 1-4, and the Y-Wing lens of FIGS. 5-8 (described below) the simultaneous imaging of the reticle onto two wafers significantly increases wafer throughputs, and that is particularly desirable as wafer sizes approach 450 mm, while retaining the high resolution made possible by an extremely high NA (e.g. at least 1.3 and preferably at least 1.35), using ArF water immersion and a Catadioptric optical design, without the use of beamsplitters.

The optical design configuration of the Sumo lens, shown in FIGS. 1-4, provides sufficient physical separation (e.g. 1.5 meters) between stages for a pair of 450 mm wafers to allow imaging of a pair of wafers, independently of each other over their full range of movement, without mechanical interference with each other, or with the reticle stage.

In addition, with each of the Sumo and Y Wing lens configurations, each optical path between reticle and imaging location preferably includes a spherical mirror and Schupmann lenses. This avoids the problem of pupil vignetting seen in some prior art that uses only one concave mirror shared between the two reticle-wafer paths, even at a high NA of 1.3, and also provides sufficient chromatic aberration correction to use existing ArF Excimer lasers for illuminating the reticle.

FIGS. 5-8 illustrate another version of a system according to the present invention, for simultaneously imaging a reticle to a pair of imaging locations. In FIGS. 5-8, which is referred to by applicants as the Y-Wing lens, the reticle 102 would be similar to the reticle of the Sumo lens of FIGS. 1-4. Also, the Y Wing imaging optical system has a central portion 106a that directs light from the reticle 102 to a V-fold mirror 110a. The Y Wing lens has a pair of arms (Arm 1a and Arm 2a) that are different from the arms of the Sumo lens of FIGS. 1-4, primarily in the transmission of light from the V-fold mirror 110a to the plane mirror 112a of each arm. In the Y Wing lens of FIGS. 5-8, there is "direct" transmission between the V-fold mirror 110a and the plane mirror 112a of each arm (meaning that there are no refractive optics along the optical axis 200 between the V-fold mirror 110a and the plane mirror 112a of each arm).

Thus, in the Y Wing lens of FIGS. 5-8, the central portion 106a has a series of refracting optics that transmit light from the reticle 102 to a V-fold mirror 110a. The Y-Wing lens includes a pair of arms, labeled arm 1a and arm 2a in FIG. 5. Each arm comprises catadioptric optics, including (a) a plane mirror 112a, a concave mirror 114a, a direct transmission of light from the V-fold mirror 110a and the plane mirror 112a (i.e. no refracting optics along the optical axis from the V-fold mirror 110a to the plane mirror 112a), and a series of refracting optics between the concave mirror 114a and the imaging location 104 for that arm.

Figure 6:
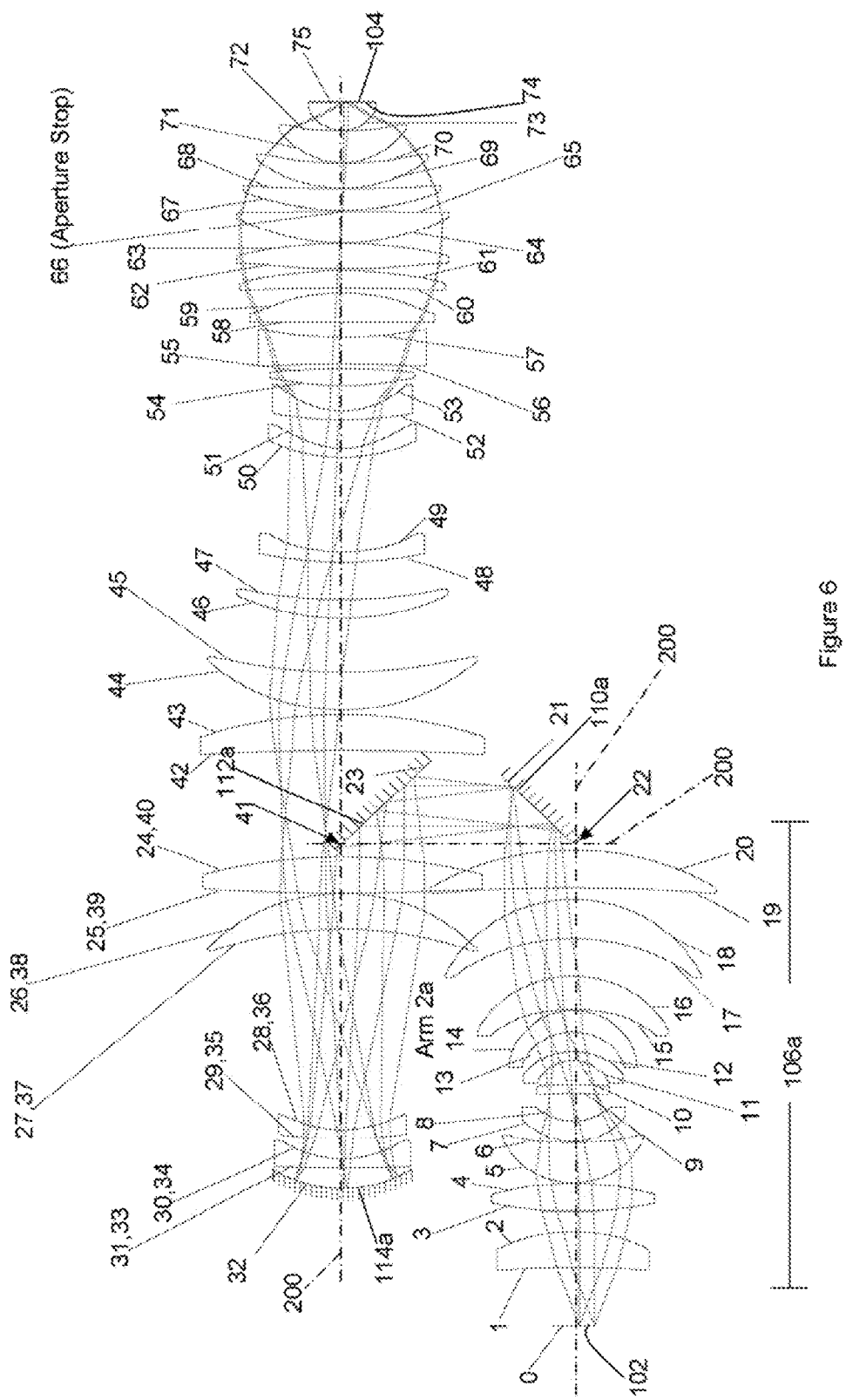
FIG. 6 is a schematic illustration of a portion of the catadioptric imaging optical system of FIG. 5, that is useful as a reference for the optics prescriptions of FIGS. 8a-6c (the portion of the imaging optical system is rotated 90 degrees counterclockwise from the orientation of FIG. 5)
Figure 7:
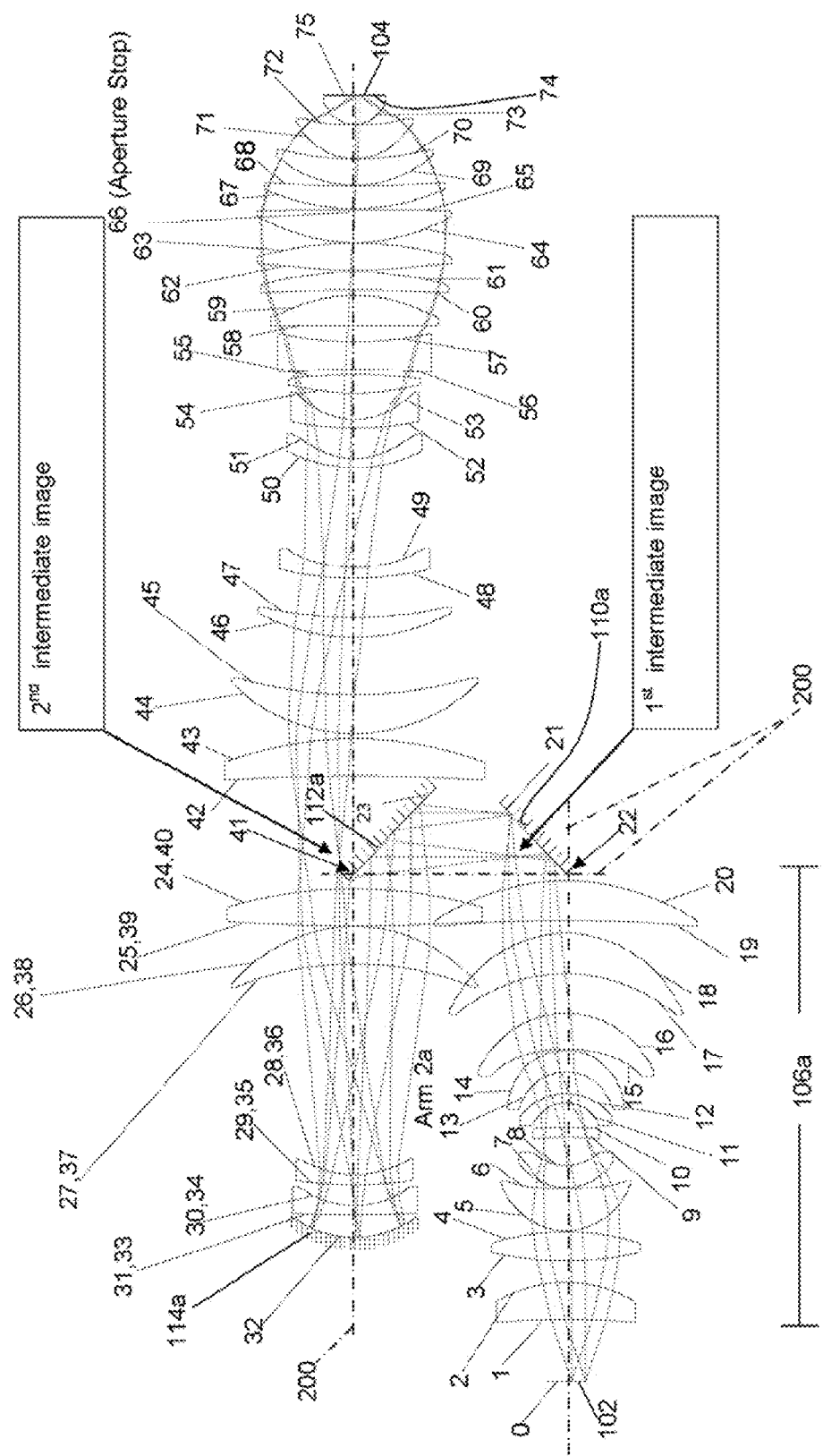
FIG. 7 is a schematic illustration of a portion of a catadioptric imaging optical system similar to FIG. 6, and showing the locations at which images of the reticle that are produced by the imaging optics, according to the principles of the present invention.

FIGS. 6 and 7 specifically illustrate the arm 2a, and FIGS. 8a-8c provide the lens prescriptions for the optics of the central portion 106a and the arm 2a. The optics of arm 1a are identical to the optics of arm 2a, so that the lens prescriptions of FIGS. 8a-8c provide a complete description of the optics of the central portion and of both arms.

Moreover, in the Y-Wing lens of FIGS. 5-8, in the transmission of light from the reticle 102 to each imaging location 104, there are images of the reticle produced at two locations (one less than with the Sumo), and those locations are illustrated for arm 2a in FIG. 7. It should be noted that like the Sumo lens one of those images is proximate the plane mirror 112 for the arm (where it is less likely to be affected by the transmitted light), and is located so that transmission of the image from the concave mirror 114 to the imaging location is not obscured by the plane mirror 112.

In the Y-Wing lens of FIGS. 5-8, because of the direct transmission of light from the V-fold mirror 110 to the plane mirror 112 of each arm, and the creation of two images of the reticle (as opposed to three images in the Sumo) the Y-Wing lens is more compact than the Sumo lens. Moreover, alignment is simpler, because there are fewer optics that need to be aligned, to produce the desired imaging quality at the imaging locations.

Thus, the Sumo and Y-Wing lens configurations, enable imaging of a pair of object fields from a single reticle to a pair of imaging locations, thereby to enable imaging of the pair of object fields to separate wafers. The lens configurations provide the ability to image wafers at the pair of imaging locations, simultaneously, without moving optics. An advantage of being able to use a single reticle in this manner is reduced cost of reticle ownership, compared with schemes that use two reticles. Also, the capability to simultaneously image two wafers from object fields of a single reticle significantly increases wafer throughputs, particularly as wafer sizes approach 450 mm, while retaining the high resolution made possible by an extremely high NA (e.g. at least 1.3 and preferably at least 1.35), using ArF water immersion and a Catadioptric optical design, and without the use of beam splitters. These features of the lens configurations are designed for use in an ArF Immersion photolithographic scanner.

It should also be noted that the Sumo lens of FIGS. 1-4, allows sufficient physical separation between the two 450 mm wafer stages, e.g. about 1.5 meters, to allow imaging of the wafers independently of each other over their full range of movement, without mechanical interference with each other, or with the reticle stage.

Still further, it should be noted that the Y-Wing configuration of FIGS. 5-8, provides a relatively compact high NA Catadioptric projection optics design that provides simultaneous imaging of two image fields to separate wafers, from adjacent object fields on a single reticle. Also, the Y-Wing lens configuration is also designed for use in an ArF Immersion photolithographic scanner. The Y-Wing lens of FIGS. 5-8 is simpler and more compact than the Sumo lens of FIGS. 1-4, while retaining the ability to image, simultaneously, without moving optics, images from a single reticle onto two wafers. Moreover, the Y-Wing lens allows a relatively short physical separation, for example of about 600 mm, between the wafers. In addition, the shorter physical separation between the two optical channels facilitates a more stable mechanical mounting arrangement. Still further, with the Y-Wing lens of FIGS. 5-8, each optical path between reticle and wafer has two intermediate images, rather than the three intermediate images with the Sumo lens of FIGS. 1-4. The resulting avoidance of a refracting relay in the horizontal arms leads to a reduced lens element count that, for each image, is no more complex than prior-art single-wafer Catadioptric projection lenses. It will also be significantly easier to align during manufacture than the Sumo lens, since the refracting lens groups of each channel are on only two optical axes, rather than three.

Thus, the foregoing description provides useful concepts for an imaging optical system configured to simultaneously image a reticle to the pair of imaging locations are provided, where the imaging optics comprise a pair of arms, each of which includes catadioptric imaging optics. In addition, the imaging optics are preferably designed to image a reticle simultaneously to the pair of imaging locations, at a numerical aperture of at least 1.3, and without obscuration of light by the imaging optics (but it will recognized by those in the art that the principles of the present invention may also be useful with imaging optics at lower numerical aperature). With the foregoing disclosure in mind, various ways of simultaneously imaging a reticle to a pair of imaging locations will become apparent to those in the art.

The invention claimed is:

1. An imaging optical system for imaging a reticle to a pair of imaging locations, comprising imaging optics configured to simultaneously image the reticle to the pair of imaging locations, wherein the imaging optics forms an image of an object arranged on a first surface of the reticle on a second surface at one of the pair of imaging locations, by catadioptric imaging optics that comprises a first optical system arranged between the first surface and the second surface;

a second optical system, arranged in an optical path between the first optical system and the second surface, having a concave mirror; and a third optical system arranged in an optical path between the second optical system and the second surface, wherein a first intermediate image is formed in an optical path between the first optical system and the second optical system, and a second intermediate image of a primary image of the first intermediate image is formed in an optical path between the second optical system and the third optical system, wherein the second optical system further comprising positive lenses, and wherein the positive lenses are arranged in an optical path between the first intermediate image and the concave mirror, and between the concave mirror and the second intermediate image.

2. The imaging optical system of claim 1, comprising a first optical axis and a second optical axis which is parallel to the first optical axis.

3. The imaging optical system of claim 2, the first optical system having the first optical axis, and the third optical system having the second optical axis.

4. The imaging optical system of claim 3, the second optical system having the second optical axis.

5. The imaging optical system of claim 2, further comprising folding mirrors.

6. The imaging optical system of claim 5, wherein the folding mirrors are arranged between the optical path between the first optical system and the second optical system.

7. The imaging optical system of claim 1, wherein the first optical system is a dioptric imaging optical system, and the third optical system is a dioptric imaging optical system.

8. The imaging optical system of claim 1, the second optical system having a negative lens between the positive lenses and the concave mirror.

9. The imaging optical system of claim 1, the second optical system having negative lenses between the positive lenses and the concave mirror.

10. An imaging optical system for imaging a reticle to a pair of imaging locations, comprising imaging optics configured to simultaneously image the reticle to the pair of imaging locations, wherein the imaging optics forms an image of an object arranged on a first surface of the reticle on a second surface at one of the pair of imaging locations, by catadioptric imaging optics that comprises a first optical system arranged between the first surface and the second surface, and arranged along a first optical axis;

a second optical system, arranged in an optical path between the first optical system and the second surface, having a concave mirror; and a third optical system arranged in an optical path between the second optical system and the second surface, wherein a first intermediate image is formed in an optical path between the first optical system and the second optical system, and a second intermediate image of a primary image of the first intermediate image is formed in an optical path between the second optical system and the third optical system, wherein the second and third optical systems are arranged along an second optical axis parallel to the first optical axis.

11. The imaging optical system of claim 10, further comprising folding mirrors.

12. The imaging optical system of claim 11, wherein the folding mirrors are arranged at the optical path between the first optical system and the second optical system.

13. The imaging optical system of claim 11, wherein no lens is arranged between the folding mirrors.

14. The imaging optical system of claim 10, wherein the first optical system is a dioptric imaging optical system, and the third optical system is a dioptric imaging optical system.

* * * * *

UNITED STATES PATENT AND TRADEMARK OFFICE
CERTIFICATE OF CORRECTION

PATENT NO.        : 8,705,170 B2
APPLICATION NO.   : 12/547086
DATED             : April 22, 2014
INVENTOR(S)       : David M. Williamson et al.

Page 1 of 1

It is certified that error appears in the above-identified patent and that said Letters Patent is hereby corrected as shown below:

In the Claims:

Column 6, Claim 1, line 52, please change "further comprising" to -- further comprises --

Column 8, Claim 10, line 13, please change "along an second" to -- along a second --

Signed and Sealed this
Fifth Day of August, 2014

Michelle K. Lee
*Deputy Director of the United States Patent and Trademark Office*